(12) United States Patent
Zeng et al.

(10) Patent No.: US 9,400,433 B2
(45) Date of Patent: Jul. 26, 2016

(54) LITHOGRAPHY ILLUMINATION SYSTEM

(71) Applicant: Shanghai Institute of Optics And Fine Mechanics, Chinese Academy of Sciences, Shanghai (CN)

(72) Inventors: Aijun Zeng, Shanghai (CN); Linglin Zhu, Shanghai (CN); Ruifang Fang, Shanghai (CN); Huijie Huang, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 0 days.

(21) Appl. No.: 14/745,361

(22) Filed: Jun. 19, 2015

(65) Prior Publication Data

US 2015/0286144 A1    Oct. 8, 2015

Related U.S. Application Data

(63) Continuation-in-part of application No. PCT/CN2013/000493, filed on Apr. 28, 2013.

(30) Foreign Application Priority Data

Jan. 25, 2013  (CN) .......................... 2013 1 0030574

(51) Int. Cl.
*G03B 27/72* (2006.01)
*G03B 27/54* (2006.01)
(Continued)

(52) U.S. Cl.
CPC ............ *G03F 7/7015* (2013.01); *G02B 3/0037* (2013.01); *G02B 19/0047* (2013.01); *G02B 26/101* (2013.01); *G03F 7/70066* (2013.01); *G03F 7/70075* (2013.01)

(58) Field of Classification Search
CPC ............ G03F 7/70566; G03F 7/70141; G03F 7/70075
USPC ..................... 355/52, 53, 55, 67–71
See application file for complete search history.

(56) References Cited

U.S. PATENT DOCUMENTS 7,187,430 B2    3/2007  Oskotsky et al.
9,110,383 B2 *  8/2015  Goehnermeier .... G03F 7/70566
                                                            355/71

(Continued)

FOREIGN PATENT DOCUMENTS

CN    101174093 A    5/2008
CN    101916047 A    12/2010
CN    102566294 A    7/2012

OTHER PUBLICATIONS

Jorg Zimmermann et al., "Generation of arbitrary freeform source shapes using advanced illumination systems in high-NA immersion scanners," Proc. of SPIE, vol. 7640, p. 764005 (2010).

(Continued)

*Primary Examiner* — Hung Henry Nguyen
(74) *Attorney, Agent, or Firm* — Mei & Mark LLP; Manni Li

(57) ABSTRACT

A lithography illumination system, along the transmission direction of the laser light, successively having a laser light source, a collimating and expanding unit, a pupil shaping unit, a first micro-lens array, a micro-integrator rod array, a micro-scanning slit array, a second micro-lens array, a condenser lens group, a mask, and and a motion control unit for controlling the motion of the micro scanning slit array.

8 Claims, 7 Drawing Sheets

(51) Int. Cl.
*G03F 7/20* (2006.01)
*G02B 3/00* (2006.01)
*G02B 19/00* (2006.01)
*G02B 26/10* (2006.01)

(56) References Cited

U.S. PATENT DOCUMENTS

| | | |
|---|---|---|
| 2002/0109108 A1 | 8/2002 | Mizouchi |
| 2007/0146853 A1 | 6/2007 | Singer et al. |
| 2007/0165202 A1* | 7/2007 | Koehler ............... G03F 7/702 355/67 |
| 2016/0109808 A1* | 4/2016 | Zeng ............... G03F 7/70058 355/67 |

OTHER PUBLICATIONS

Liping Guo et al., "Study of integrator rod in step-and-scan lithography," Acta Photonica Sinica, vol. 35(7), pp. 981-985 (2006) ISSN 1004-4213.

Han, Jingfu, "Optical parts in the MD projector (IV)-micro lens array and rod integrator," Advanced Display, No. 111, pp. 5-7 and 12 (Apr. 2010) ISSN 1006-6268.

* cited by examiner

LITHOGRAPHY ILLUMINATION SYSTEM

CROSS-REFERENCE AND RELATED APPLICATIONS

The subject application is a continuation-in-part of PCT international application PCT/CN2013/000493 filed on Apr. 28, 2013, which in turn claims priority on Chinese patent application CN 201310030574.9 filed on Jan. 25, 2013. The contents and subject matters of all the priority applications are incorporated herein by reference.

TECHNICAL FIELD

The present invention relates to the field of lithography techniques, particularly, a lithography illumination system.

BACKGROUND OF THE INVENTION

With rapid development of the microelectronics industry, the research and development of high-end scanning lithography tool for manufacturing large scale integrated circuit has become an urgent demand. The illumination system may provide high illumination uniformity, control exposure dose, and implement off-axis illumination for the lithography tool to improve the resolution and increase the depth of the focus, and it is an important part of the lithography tool. So the performance of the illumination system may directly affect the performance of the lithography tool.

U.S. Pat. No. 7,187,430B and an article entitled "Generation of arbitrary freeform source shapes using advanced illumination systems in high-NA immersion scanners" by Jorg Zimmermann et al., Proc. of SPIE, Vol.7640, 764005(2010), both disclose a general lithography illumination system as shown in FIG. 1. The system includes a laser light source 1, a collimating and expanding unit 2, a pupil shaping unit 3, a first micro-lens array 4, a second micro-lens array 5, a condenser lens group 6, a scanning slit 7, an illumination lens group 8, and a mask 9, where the first micro-lens array 4 and the second micro-lens array 5 form a homogenizer unit of the lithography illumination system. A laser beam goes through the collimating and expanding unit 2 and pupil shaping unit 3 to form a required illumination mode. The laser beam is homogenized by the homogenizer unit and focused by the condenser lens group 6, and then, forms a uniform light field on the back focal plane of the condenser lens group 6. The uniform light field is imaged onto the mask 9 by the illumination lens group 8 after passing through the scanning slit 7, the scanning slit 7 scans the uniform light field on the back focal plane of the condenser lens group 6 so that the light field on the mask is correspondingly scanned. The scanning speed of the scanning slit 7 is very fast, up to several hundred millimeters per second, and generates certain vibration to affect the mask 9, thereby affecting the performance of lithography system, so it is necessary to introduce the illumination lens group 8 to separate the scanning slit and the mask. The illumination lens group 8 generally has large aperture (nearly 300 mm) and many lenses (10 pieces or so), which reduces the system's transmittance, reduce energy usage ratio, and makes the structure complex.

SUMMARY OF THE INVENTION

In order to overcome the deficiencies of the prior art technology, the present invention provides a lithography illumination system that decreases the scanning distance and scanning speed of the scanning slit, reduces the influence of the vibration introduced by the scanning slit, improves the transmittance of the system, achieves non-polarized illumination, and has simple structure.

The lithography illumination system of the present invention comprises a laser light source, a collimating and expanding unit, a pupil shaping unit, a first micro-lens array, a second micro-lens array, a condenser lens group, a mask, a micro-scanning slit array, a motion control unit, and a micro-integrator rod array. The components in the lithography illumination system of the present invention is spatially arranged as follows: a beam emitted from the laser light source sequentially passes through the collimating and expanding unit, the pupil shaping unit, the first micro-lens array, the micro-integrator rod array, the micro-scanning slit array, the second micro-lens array, the condenser lens group, and then, illuminates the mask; the motion control unit is connected to the micro-scanning slit array to control the moving speed and distance of the micro-scanning slit array to scan the light field; the first micro-lens array is located at the exit pupil plane of the pupil shaping unit; the entrance end surface of the micro-integrator rod array is located at the back focal plane of the first micro-lens array; the exit end surface of the micro-integrator rod array is located at the front focal plane of the second micro-lens array; the back focal plane of the second micro-lens array and the mask are a pair of conjugated planes of the condenser lens group; the first micro-lens array is composed of multiple identical first micro-lenses; the second micro-lens array is composed of multiple identical second micro-lenses; the micro-integrator rod array is composed of multiple identical micro-integrator rods; the first micro-lens, the micro-integrator rod, and the second micro-lens are in one-to-one correspondence.

In the present invention, the first micro-lens array is composed of multiple identical first micro-lenses; the first micro-lenses are closely linked to each other; and the first micro-lens is a cylindrical lens or spherical lens.

In the present invention, the second micro-lens array is composed of multiple identical second micro-lenses; the second micro-lens is a cylindrical lens or spherical lens; and the field angle of the second micro-lens is different from that of the first micro-lens.

In the present invention, the micro-integrator rod array is composed of multiple identical micro-integrator rods; the micro-integrator rod is rectangular; two ends of the micro-integrator rods are respectively fixed by the first support frame and the second support frame in a two-dimension matrix with certain interval; and the size of the interval is equal to or greater than that of the end surface of the micro-integrator rod.

In the present invention, the micro scanning slit array is composed of multiple identical micro-scanning slits; the micro-scanning slit is located at the exit end surface of the micro-integrator rod and interspersed in the intervals of the micro-integrator rods.

In the present invention, the motion control unit is to control the micro scanning slit array to move in one dimension or two dimension.

Comparing with the previous technology, the lithography illumination system of the present invention uses a micro-integrator rod array as the homogenizer, it not only achieves non-polarized illumination but also skillfully combines the homogenizer and scanning slit. The lithography illumination system of the present invention uses only a condenser lens group to separate the scanning slit and the mask so as to eliminate the need for the illumination lens group with large aperture (nearly 300 mm) and many lenses (10 pieces or so), reducing the absorption loss of the system, increasing the transmittance, improving the energy efficiency, and simplifying the system structure.

The lithography illumination system of the present invention adopts a micro-scanning slit array instead of a conventional scanning slit so that the scanning distance and scanning speed of micro-scanning slit array are greatly reduced, thus reducing the vibration introduced by the scanning slit and the vibration influence and improving the system performance.

BRIEF DESCRIPTION OF THE DRAWINGS

FIG. 3, including FIG. 3A shows the front view the micro-integrator rod array 11; FIG. 3B shows the side view of the micro-integrator rod array 11.

DETAILED DESCRIPTION AND PREFERRED EMBODIMENTS OF THE INVENTION

The present invention is further illustrated in the example and drawings, but the scope of protection should not be limited to the examples.

Figure 1:
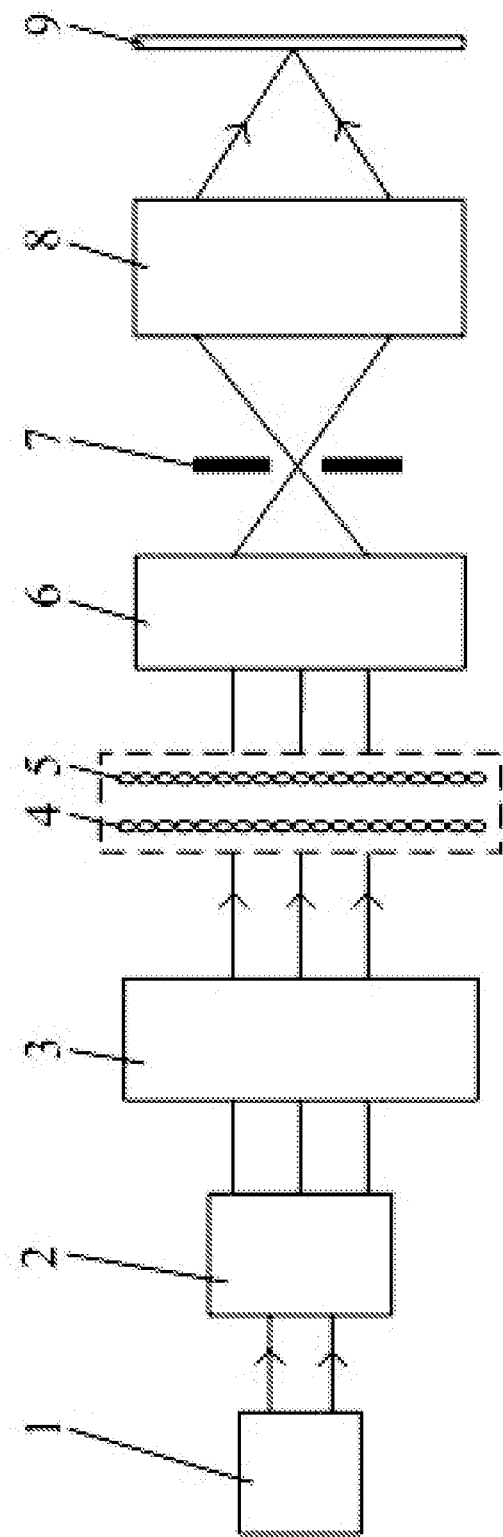
FIG. 1 shows a lithography illumination system of the prior art.
Figure 2:
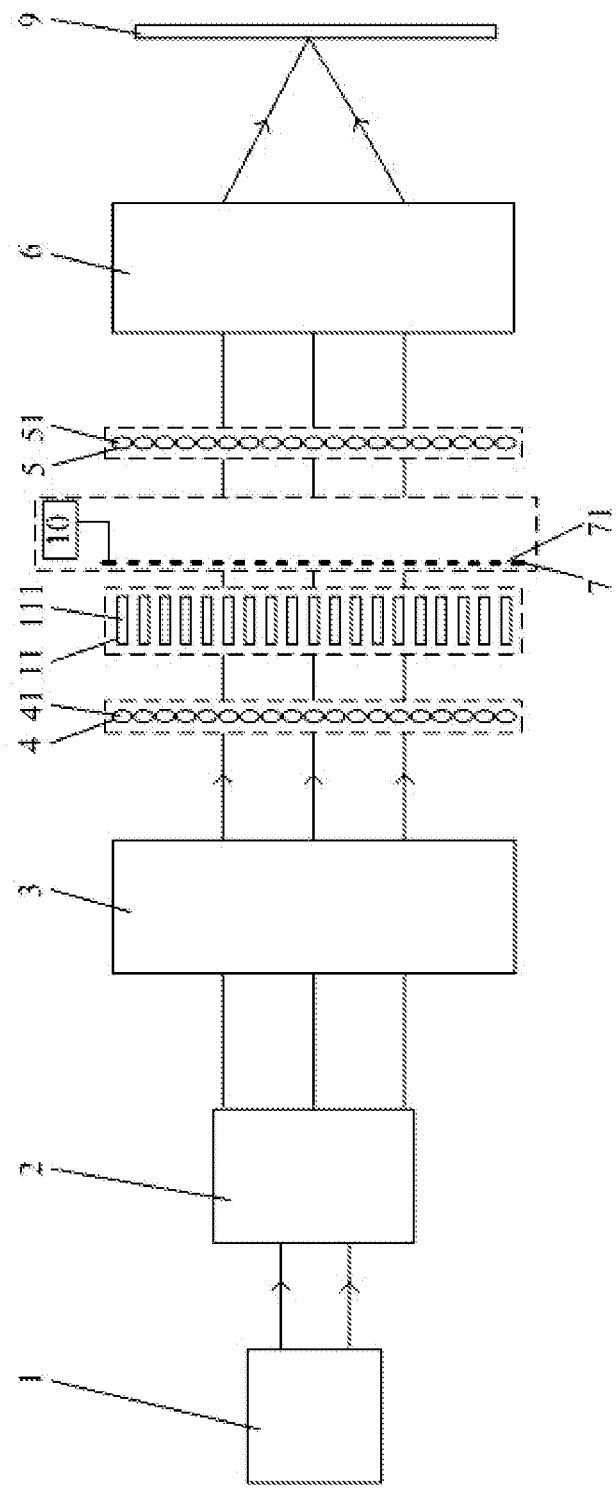
FIG. 2 shows the lithography illumination system of the present invention.

As shown in FIG. 2, the lithography illumination system of the present invention comprises a laser light source 1, a collimating and expanding unit 2, a pupil shaping unit 3, a first micro-lens array 4, a second micro-lens array 5, a condenser lens group 6, a micro-scanning slit array 7, a mask 9, a motion control unit 10, and a micro-integrator rod array 11. The components are spatially arranged as follows: a beam emitted from the laser light source 1 sequentially passes through the collimating and expanding unit 2, the pupil shaping unit 3, the first micro-lens array 4, the micro-integrator rod array 11, the micro-scanning slit array 7, the second micro-lens array 5, and the condenser lens group 6, and then, illuminates the mask 9; the motion control unit 10 is connected to the micro-scanning slit array 7 for controlling the moving speed and distance of the micro-scanning slit array 7 to scan the light field; the first micro-lens array 4 is located at the exit pupil plane of the pupil shaping unit 3; the entrance end surface of the micro-integrator rod array 11 is located at the back focal plane of the first micro-lens array 4; the exit end surface of the micro-integrator rod array 11 is located at the front focal plane of the second micro-lens array 5; the back focal plane of the second micro-lens array 5 and the mask 9 are a pair of conjugated planes of the condenser lens group 6.

The first micro-lens array 4 is composed of multiple identical first micro-lenses 41; the first micro-lenses 41 are closely linked to each other; and the first micro-lens 41 is a cylindrical lens or spherical lens.

The second micro-lens array 5 is composed of multiple identical second micro-lenses 51; the second micro-lenses 51 are closely linked to each other; the second micro-lens 51 is a cylindrical lens or spherical lens; and the field angle of the second micro-lens 51 is different from that of the first micro-lens 41.

The micro-integrator rod array 11 is composed of multiple identical micro-integrator rods 111; the micro-integrator rod 111 is rectangular; the micro-integrator rod 111, the first micro-lens 41 and the second micro-lens 51 are in one-to-one correspondence.

Figure 3B:
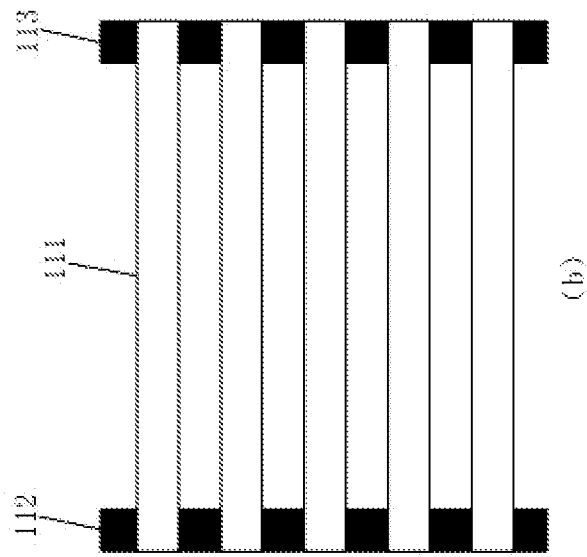
FIGS. 3A and 3B, shows an embodiment of the micro-integrator rod array of the present invention.
Figure 3A:
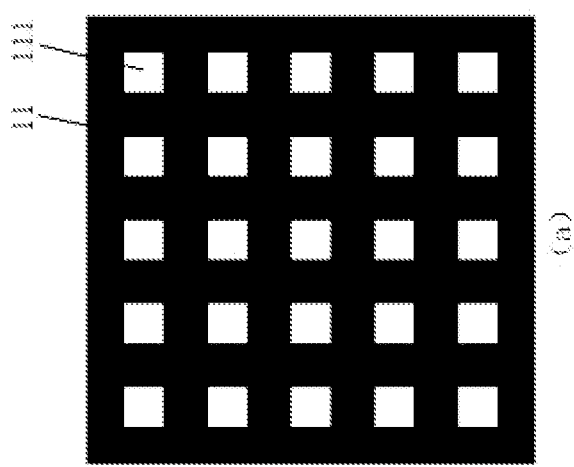

As shown in FIGS. 3A and 3B, the two ends of the micro-integrator rods 111 are respectively fixed by the first support frame 112 and the second support frame 113 in a two-dimension matrix with an interval, the size of the interval is equal to or greater than that of the end surface of the micro-integrator rod 111.

The micro-scanning slit array 7 is composed of multiple identical micro-scanning slits 71; the micro-scanning slit 71 is located at the exit end surface of the micro-integrator rod 111 and interspersed in the intervals of the micro-integrator rods 111.

Figure 4:
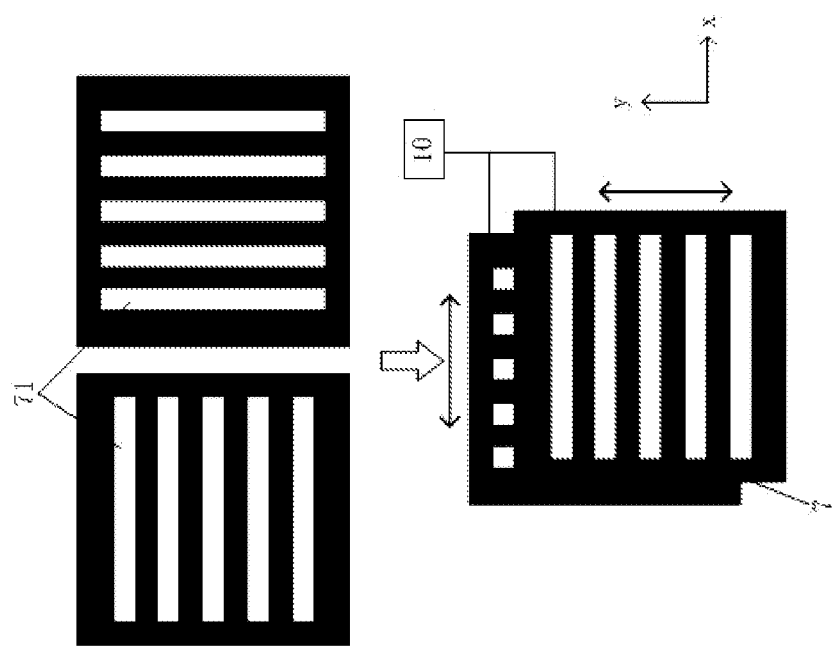
FIG. 4 shows an embodiment of the micro-scanning slit array of the present invention.
Figure 5:
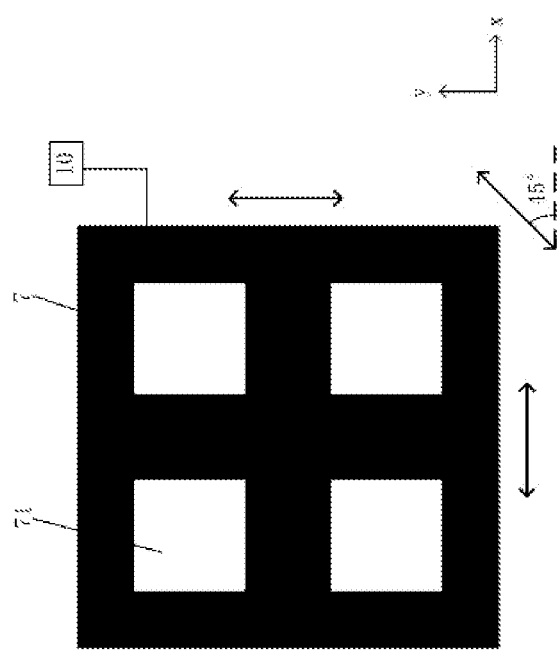
FIG. 5 shows another embodiment of the micro-scanning slit array of the present invention.

As shown in FIGS. 4 and 5, there are two embodiments of the micro-scanning slit array in the present invention, the black part indicates opaque portion, the white part indicates nonopaque portion which is the micro-scanning slit 71. As shown in FIG. 4, a two micro-scanning slit array is adopted with different nonopaque directions to superposition. When the first micro-scanning slit array whose nonopaque direction is along y axis is controlled by the motion control unit 10 to move along X axis, the X-direction of the light field is scanned. When the second micro-scanning slit array whose nonopaque direction is along X axis is controlled by the motion control unit 10 to move along Y axis, the Y-direction of the light field is scanned. So when two micro-scanning slit arrays respectively and simultaneously move along X axis and Y axis, the light field is scanned in two dimension.

As shown in FIG. 5, the two micro-scanning slit arrays shown in FIG. 4 are combined and integrated into one micro-scanning slit array. When it is controlled by the motion control unit 10 to move along X axis, the X-direction of the light field is scanned, when moving along Y axis, the Y-direction of the light field is scanned, and when moving along the angle bisectors of the X axis and Y axis, the light field is scanned in two dimension.

The motion control unit 10 is to control the micro-scanning slit array 7 to move in one dimension or two dimension.

Figure 6:
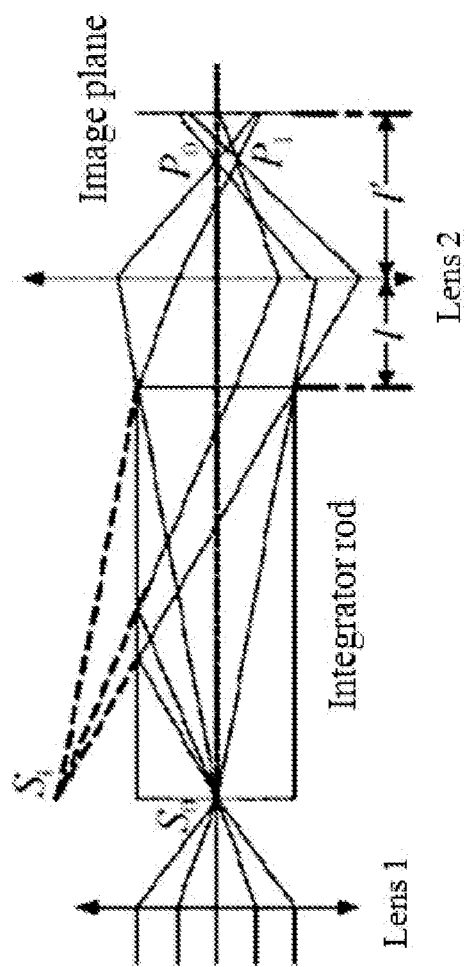
FIG. 6 shows a homogenization schematic diagram of the integral rod of the prior art.

The principle of the homogenization and scanning image applied in the present invention are described in details as follows. As to the homogenization principle of integrator rod, as disclosed in an article entitled "Study of integrator rod in step-and-scan lithography" by Liping Guo et al., Acta Photonica Sinica, Vol. 35(7), 981-984, 2005 and shown in FIG. 6, a parallel beam is focused and coupled into the integrator rod after passing through the Lens 1 and then the beam is repeatedly reflected inside the integrator rod to form virtual point light source on the entrance end surface of the integrator rod (such as $S_0$, $S_1$ etc. shown in FIG. 6), and every virtual point light source represents a small-diameter thin beam in the incident beam. Each of them has a corresponding image point on the image plane of Lens 2 (such as $P_0$, $P_1$ etc. shown in FIG. 6), and then, the corresponding thin beam is imaged onto the same area of the image plane of Lens 2. So the superposition of these thin beams generates a uniform light field on the image plane of Lens 2.

Figure 7:
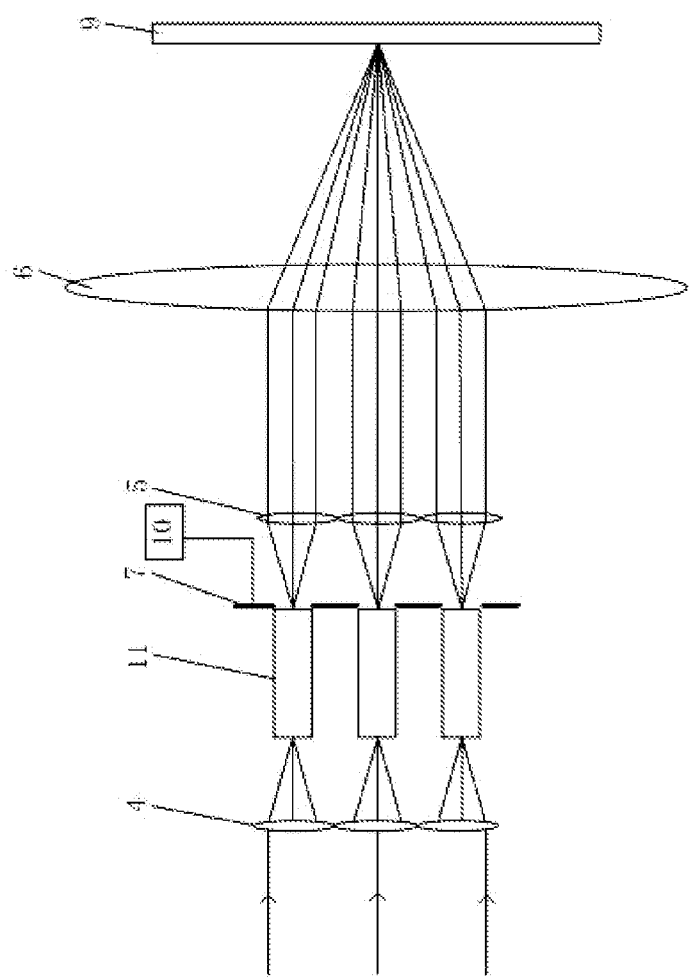
FIG. 7 shows a simple schematic diagram of the homogenization and scanning image of the lithography illumination system of the present invention.

Based on the homogenization principle of integrator rod, referring to FIG. 7, the simple schematic diagram of the homogenization and scanning image of the lithography illumination system of the present invention is illustrated. According to FIG. 7, the beam is segmented and coupled into the micro-integrator rod array 11 by the first micro-lens array 4 after passing through the pupil shaping unit 3. Every segmented sub-beam is repeatedly reflected and turned in the corresponding micro-integrator rod 111, and then form a uniform light field at the exit end surface of the micro-integrator rod 111. The exit end surfaces of the micro-integrator rods 111 are equivalent to the same sub-light sources. These sub-light sources are respectively located in the front focal planes of the second micro-lenses 51, so that the beam is changed into parallel light after passing through the micro-lens 51 and then is focused and imaged onto the mask 9 by the condenser lens group 6. The beam emitted from the same positions of the exit end surfaces of the micro-integrator rods 111 is focused on the same point of the mask 9 after passing through the second micro-lens 51 and the condenser lens group 6. In other words, the light field on the mask 9 is the superposition of the uniform light field on the exit end surface of each micro-integrator rod 111, so that a uniform light field is formed on the mask 9. So if the micro-scanning slit 71 scans the uniform light field on the exit end surface of the micro-integrator rod 111, the light field on the mask 9 is accordingly be scanned. Thus, the homogenizer is skillfully combined with the scanning slit, which eliminates the use of illumination lens group. Meanwhile, the light field exit from the micro-integrator rod array 11 is non-polarized because of the repeated reflection of the micro-integrator rod 111 so that achieving non-polarized illumination. It should be noted that when the size of the end surface of the micro-integrator rod 111 is fixed, the longer the micro-integrator rod 111 is, the better its homogenization effect is, but the greater absorption loss is. So the requirement of the system transmittance must be considered while pursuing highly uniform light field.

The lithography illumination system of the present invention adopts a micro-integrator rod array and a micro-scanning slit array to achieve homogenization and scanning. The system greatly decreases the scanning distance and scanning speed of the scanning slit to reduce the vibration impact, eliminates the use of illumination lens group to greatly improve system's transmittance, simplifies the system's structure, and achieves non-polarized illumination.

We claim:

1. A lithography illumination system comprising:
   a laser light source,
   a collimating and expanding unit,
   a pupil shaping unit having an exit pupil plane,
   a first micro-lens array having a back focal plane and being composed of multiple identical first micro-lenses, and each of the first micro-lenses having a field angle,
   a second micro-lens array having a front focal plane and a back focal plane, and being composed of multiple identical second micro-lenses, and each of the second micro-lenses having a field angle,
   a condenser lens group,
   a mask,
   a micro-scanning slit array,
   a motion control unit, and
   a micro-integrator rod array having an entrance end surface and an exit end surface, and being composed of multiple identical micro-integrator rods;
   wherein lithography illumination system is arranged such that a beam emitted from the laser light source passes sequentially through the collimating and expanding unit, the pupil shaping unit, the first micro-lens array, the micro-integrator rod array, the micro-scanning slit array, the second micro-lens array, and the condenser lens group, and illuminates the mask;
   the motion control unit is connected to the micro-scanning slit array for controlling a moving speed and distance of the micro-scanning slit array to scan a light field;
   the first micro-lens array is located at the exit pupil plane of the pupil shaping unit;
   the entrance end surface of the micro-integrator rod array is located at the back focal plane of the first micro-lens array;
   the exit end surface of the micro-integrator rod array is located at the front focal plane of the second micro-lens array;
   the back focal plane of the second micro-lens array and the mask are a pair of conjugated planes of the condenser lens group; and
   each of the first micro-lenses, the micro-integrator rods, and the second micro-lenses are in one-to-one correspondence.

2. The lithography illumination system of claim 1, wherein the first micro-lenses are closely linked to each other, and each of the first micro-lenses is a cylindrical lens or a spherical lens.

3. The lithography illumination system of claim 1, wherein the second micro-lenses are closely linked to each other, and each of the second micro-lenses is a cylindrical lens or a spherical lens.

4. The lithography illumination system of claim 1, wherein the field angle of the second micro-lens is different from the field angle of the first micro-lens.

5. The lithography illumination system of claim 1, wherein the micro-integrator rod is rectangular, two ends of the micro-integrator rods are respectively fixed by a first support frame and a second support frame in a two-dimension matrix with an interval, size of the interval is equal to or greater than a size of an end surface of the micro-integrator rod.

6. The lithography illumination system of claim 1, wherein the micro-scanning slit array is composed of multiple identical micro-scanning slits, each of the micro-scanning slits is located at the exit end surface of the micro-integrator rods and interspersed in the intervals of the micro-integrator rods.

7. The lithography illumination system of claim 1, wherein the micro-scanning slit array is composed of a first micro-scanning slit array having a nonopaque direction along a Y axis and a second micro-scanning slit array having a nonopaque direction along an X axis;
   when the first micro-scanning slit array is controlled by the motion control unit to move along the X axis, X-direction of a light field is scanned in one dimension;
   when the second micro-scanning slit array is controlled by the motion control unit to move along the Y axis, Y-direction of the light field is scanned in one dimension; and
   when the first and second micro-scanning slit arrays respectively and simultaneously move along the X axis and Y axis, the light field is scanned in two dimension.

8. The lithography illumination system of claim 1, wherein the micro-scanning slit array is composed of a plurality of small-square scanning slits in two-dimension distribution;
   when the small-square scanning slit is controlled by the motion control unit to move along an X axis, X-direction of a light field is scanned;
   when the small-square scanning slit is controlled by the motion control unit to move along an Y axis, Y-direction of the light field is scanned; and
   when the small-square scanning slit is controlled by the motion control unit to move along an angle bisectors of the X axis and the Y axis, the light field is scanned in two dimension.

* * * * *